US012532610B2

(12) United States Patent
Wang et al.

(10) Patent No.: US 12,532,610 B2
(45) Date of Patent: Jan. 20, 2026

(54) STRETCHABLE DISPLAY SUBSTRATE, PREPARATION METHOD OF STRETCHABLE DISPLAY SUBSTRATE, AND DISPLAY APPARATUS

(71) Applicant: BOE Technology Group Co., Ltd., Beijing (CN)

(72) Inventors: Bingwei Wang, Beijing (CN); Jia Zhao, Beijing (CN); Jing Wang, Beijing (CN); Pinfan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 927 days.

(21) Appl. No.: 17/755,131

(22) PCT Filed: Apr. 30, 2021

(86) PCT No.: PCT/CN2021/091405
§ 371 (c)(1),
(2) Date: Apr. 21, 2022

(87) PCT Pub. No.: WO2022/226981
PCT Pub. Date: Nov. 3, 2022

(65) Prior Publication Data
US 2024/0188351 A1   Jun. 6, 2024

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/131* (2023.02); *H10K 59/873* (2023.02); *H10K 2102/311* (2023.02)

(58) Field of Classification Search
CPC ............... H10K 29/122; H10K 29/131; H10K 29/1201; H10K 29/973; H10K 2102/311
See application file for complete search history.

(56) References Cited

U.S. PATENT DOCUMENTS 11,699,364 B2 * 7/2023 Sui ...................... H10K 59/131
361/679.01
2018/0024675 A1  1/2018 Hong et al.
(Continued)

FOREIGN PATENT DOCUMENTS

CN   108288637 A   7/2018
CN   110246868 A   9/2019
(Continued)

OTHER PUBLICATIONS

Extended European Search Report, mailed Dec. 12, 2023, from European Patent App. No. 21938455.9, 9 pages.
(Continued)

*Primary Examiner* — Lex H Malsawma
(74) *Attorney, Agent, or Firm* — Workman Nydegger

(57) ABSTRACT

Embodiments of the present disclosure provide a stretchable display substrate, a preparation method of the stretchable display substrate, and a display apparatus. The stretchable display substrate includes: a plurality of hole regions; a base; pixel units, disposed on the base; signal lines, disposed on the base, and electrically connected with the pixel units; and a plurality of inorganic insulating layers, stacked on the base. At least one layer of the plurality of inorganic insulating layers has first hollowed-out portions close to the hole regions, and orthographic projections of the first hollowed-out portions on the base do not overlap orthographic projections of the signal lines and the pixel units on the base.

18 Claims, 10 Drawing Sheets

(51) Int. Cl.
  *H10K 59/131* (2023.01)
  *H10K 59/80* (2023.01)
  *H10K 102/00* (2023.01)

(56) References Cited

U.S. PATENT DOCUMENTS

| | | | |
|---|---|---|---|
| 2019/0280077 A1 | 9/2019 | Park et al. | |
| 2020/0388666 A1* | 12/2020 | Park | H10K 77/111 |
| 2020/0409419 A1 | 12/2020 | He et al. | |
| 2021/0083208 A1 | 3/2021 | Yu et al. | |
| 2021/0192983 A1* | 6/2021 | Sui | H10K 59/131 |
| 2021/0257434 A1* | 8/2021 | Xie | H10K 71/00 |
| 2021/0358343 A1 | 11/2021 | Wang | |
| 2022/0037621 A1 | 2/2022 | Xue et al. | |
| 2022/0344422 A1 | 10/2022 | Xue et al. | |

FOREIGN PATENT DOCUMENTS

| | | |
|---|---|---|
| CN | 110289292 A | 9/2019 |
| CN | 110416266 A | 11/2019 |
| CN | 110634937 A | 12/2019 |
| CN | 110854166 A | 2/2020 |
| CN | 111162106 A | 5/2020 |
| CN | 111524952 A | 8/2020 |
| CN | 111554831 A | 8/2020 |
| CN | 111653595 A | 9/2020 |
| CN | 111799399 A | 10/2020 |
| CN | 111987134 A | 11/2020 |
| CN | 112490272 A | 3/2021 |
| WO | 2020192293 A1 | 10/2020 |
| WO | 2021031188 A1 | 2/2021 |

OTHER PUBLICATIONS

Chinese First Office Action, mailed Aug. 10, 2024, from Chinese App. No. 202180001013.9, 17 pages.
Japanese Office Action, mailed Feb. 4, 2025, from Japanese App. No. JP2023-521911, 16 pages.
Korean Office Action, mailed May 21, 2025, from Korean App. No. 10-2023-7012336, 23 pages.

* cited by examiner

STRETCHABLE DISPLAY SUBSTRATE, PREPARATION METHOD OF STRETCHABLE DISPLAY SUBSTRATE, AND DISPLAY APPARATUS

CROSS-REFERENCE TO RELATED APPLICATIONS

This application is a National Stage of International Application No. PCT/CN2021/091405, filed Apr. 30, 2021, which is hereby incorporated by reference in its entirety.

FIELD

The present disclosure relates to the technical field of display, in particular to a stretchable display substrate, a preparation method of the stretchable display substrate, and a display apparatus.

BACKGROUND

With the development of a display technology, organic light-emitting diodes (OLEDs) capable of performing flexible display have promoted the diversity of display, and have gradually become the mainstream of the display technology. In some related technologies, OLED flexible display apparatuses may satisfy the bending of two-dimensional surfaces, but are not suitable for flexibility requirements of display apparatuses with more complex conditions (for example, wearable devices) for stretchable display substrates.

In order to develop a stretchable OLED display function, in some related technologies, holes are formed in a substrate material of an OLED flexible display apparatus to form islands for preparing pixel regions and bridges for wiring, and stretching of the display apparatus is achieved by using deformation of the bridges.

SUMMARY

An embodiment of the present disclosure provides a stretchable display substrate, including a plurality of hole regions;
a base;
pixel units disposed on the base;
signal lines disposed on the base, and electrically connected with the pixel units; and
a plurality of inorganic insulating layers stacked on the base, wherein at least one of the plurality of inorganic insulating layers has a first hollowed-out portions close to the hole regions, and an orthographic projection of the first hollowed-out portion on the base do not overlap orthographic projections of the signal lines and the pixel units on the base.

Optionally, the stretchable display substrate provided by embodiments of the present disclosure, further includes: a plurality of pixel island regions at intervals among the hole regions, and a connecting bridge region between the pixel island regions and the hole regions, wherein the connecting bridge region includes at least one of the pixel units, the first hollowed-out portion is in the connecting bridge region, and the first hollowed-out portion is between the pixel units of the connecting bridge region and the hole regions.

Optionally, in the stretchable display substrate provided by embodiments of the present disclosure, the connecting bridge region includes a plurality of pixel units, and the orthographic projections of the signal lines on the base are at least in orthographic projections of the pixel units of the connecting bridge region and regions between the pixel units of the connecting bridge region on the base.

Optionally, in the stretchable display substrate provided by embodiments of the present disclosure, an extending direction of the first hollowed-out portion is substantially identical to an extending direction of edges of the hole regions.

Optionally, in the stretchable display substrate provided by embodiments of the present disclosure, the first hollowed-out portion does not communicate with the hole regions.

Optionally, in the stretchable display substrate provided by embodiments of the present disclosure, a distance between a side wall, close to a corresponding hole region, of the first hollowed-out portion and a side wall, close to a corresponding first hollowed-out portion, of each of the hole regions is greater than or equal to 2 μm.

Optionally, in the stretchable display substrate provided by embodiments of the present disclosure, a width in a direction from the pixel island regions to the hole regions, of the first hollowed-out portion is greater than or equal to 5 μm.

Optionally, in the stretchable display substrate provided by embodiments of the present disclosure, the first hollowed-out portion and the hole regions communicate with each other.

Optionally, in the stretchable display substrate provided by embodiments of the present disclosure, an edge, close to a corresponding hole region, of the first hollowed-out portion overlaps an edge, close to a corresponding first hollowed-out portion, of each of the hole regions.

Optionally, in the stretchable display substrate provided by embodiments of the present disclosure, each of the pixel units includes at least one sub-pixel, the sub-pixel includes a pixel circuit and a light-emitting device, and the light-emitting device includes an anode, an organic light-emitting layer and a cathode which are stacked; a partition structure is disposed at a position, close to a corresponding pixel unit, in the connecting bridge region, the organic light-emitting layer is disconnected at the partition structure, and the cathode is disconnected at the partition structure; and a distance between side walls, close to the pixel units, of the first hollowed-out portions and the partition structures is greater than or equal to 2 μm.

Optionally, in the stretchable display substrate provided by embodiments of the present disclosure, the first hollowed-out portion is a closed structure disposed around the hole regions.

Optionally, in the stretchable display substrate provided by embodiments of the present disclosure, the partition structures are closed structures disposed around the first hollowed-out portions.

Optionally, in the stretchable display substrate provided by the embodiment of the present disclosure, a part of the hole regions include: a first sub-hole region and a second sub-hole region extending in a first direction and arranged in a second direction, and a third sub-hole region extending in the second direction; another part of the hole regions include: a fourth sub-hole region and a fifth sub-hole region extending in the second direction and arranged in the first direction, and a sixth sub-hole region extending in the first direction; the first direction is substantially perpendicular to the second direction, the third sub-hole region is substantially connected to center regions of the first sub-hole region and the second sub-hole region, and the sixth sub-hole region is substantially connected to center regions of the fourth sub-hole region and the fifth sub-hole region; and the first hollowed-out portion is disposed on at least one of following positions: one side of a connecting position of the first sub-hole region and the third sub-hole region, one side of a connecting position of the second sub-hole region and the third sub-hole region, one side of an end of the first sub-hole region and one side of an end of the second sub-hole region, one side of a connecting position of the fourth sub-hole region and the sixth sub-hole region, one side of a connecting position of the fifth sub-hole region and the sixth sub-hole region, and one side of an end of the fourth sub-hole region and one side of an end of the fifth sub-hole region.

Optionally, in the stretchable display substrate provided by embodiments of the present disclosure, one side of the connecting position of the first sub-hole region and the third sub-hole region, one side of the connecting position of the second sub-hole region and the third sub-hole region, one side of the end of the first sub-hole region and one side of the end of the second sub-hole region, one side of the connecting position of the fourth sub-hole region and the sixth sub-hole region, one side of the connecting position of the fifth sub-hole region and the sixth sub-hole region, and one side of the end of the fourth sub-hole region and one side of the end of the fifth sub-hole region are all provided with the first hollowed-out portions.

Optionally, in the stretchable display substrate provided by embodiments of the present disclosure, each of the pixel island regions includes at least one of the pixel units, and a pixel resolution of the pixel island regions is substantially identical to a pixel resolution of the connecting bridge region.

Optionally, in the stretchable display substrate provided by embodiments of the present disclosure, the plurality of inorganic insulating layers include a first barrier layer, a buffer layer, a first gate insulating layer, a second gate insulating layer, an interlayer dielectric layer, a first passivation layer, a second passivation layer and an inorganic encapsulation layer which are stacked on the base, and at least one of the first barrier layer, the buffer layer, the first gate insulating layer, the second gate insulating layer, the interlayer dielectric layer, the first passivation layer, the second passivation layer and the inorganic encapsulation layer is provided with the first hollowed-out portion.

Optionally, in the stretchable display substrate provided by embodiments of the present disclosure, the interlayer dielectric layer, the first passivation layer, the second passivation layer and the inorganic encapsulation layer are all provided with the first hollowed-out portion, and first hollowed-out portions substantially overlap.

Optionally, in the stretchable display substrate provided by embodiments of the present disclosure, the inorganic encapsulation layer includes a first inorganic layer and a second inorganic layer stacked on the second passivation layer;

the stretchable display substrate further includes: a first planar layer and a second planar layer between the interlayer dielectric layer and the first passivation layer, a pixel defining layer between the second passivation layer and the inorganic encapsulation layer, and an organic layer between the first inorganic layer and the second inorganic layer; and at least one of the first planar layer, the second planar layer, the pixel defining layer and the organic layer has a second hollowed-out portion close to the hole regions, and the first hollowed-out portion and the second hollowed-out portion substantially overlap.

Optionally, in the stretchable display substrate provided by embodiments of the present disclosure, the base includes a flexible layer, or the base includes a first flexible layer, a second barrier layer, and a second flexible layer stacked on a side, facing away from the buffer layer, of the first barrier layer.

Correspondingly, an embodiment of the present disclosure further provides a display apparatus, including the above stretchable display substrate.

Correspondingly, an embodiment of the present disclosure further provides a preparation method of the above stretchable display substrate, including:

providing the base;

forming the pixel units and the signal lines electrically connected with the pixel units on the base; and forming the plurality of inorganic insulating layers stacked on the base, wherein at least one of the plurality of inorganic insulating layers has the first hollowed-out portion close to the hole regions, and the orthographic projection of the first hollowed-out portion on the base does not overlap orthographic projections of the signal lines and the pixel units on the base.

Optionally, in the above preparation method provided by embodiments of the present disclosure, at least one layer of the plurality of inorganic insulating layers having the first hollowed-out portions close to the hole regions, includes:

depositing a first barrier layer, a buffer layer, a first gate insulating layer, a second gate insulating layer, an interlayer dielectric layer, a first passivation layer, a second passivation layer, and an inorganic encapsulation layer on the base; and forming the first hollowed-out portion in at least one of the first barrier layer, the buffer layer, the first gate insulating layer, the second gate insulating layer, the interlayer dielectric layer, the first passivation layer, the second passivation layer, and the inorganic encapsulation layer by using a patterning process.

DETAILED DESCRIPTION OF THE EMBODIMENTS

In order to make the objectives, technical solutions, and advantages of the present disclosure clearer, specific implementation of a preparation method of a stretchable display substrate provided by an embodiment of the present disclosure will be described in detail below with reference to accompanying drawings. It should be understood that preferred embodiments described below are only used to illustrate and explain the present disclosure, but not to limit the present disclosure. In addition, in the case of no conflict, the embodiments in the present application and features in the embodiments may be combined with each other.

The thickness, size and shape of each layer of film in the accompanying drawings do not reflect the true scale of the stretchable display substrate, and are only intended to illustrate the present disclosure.

Figure 1:
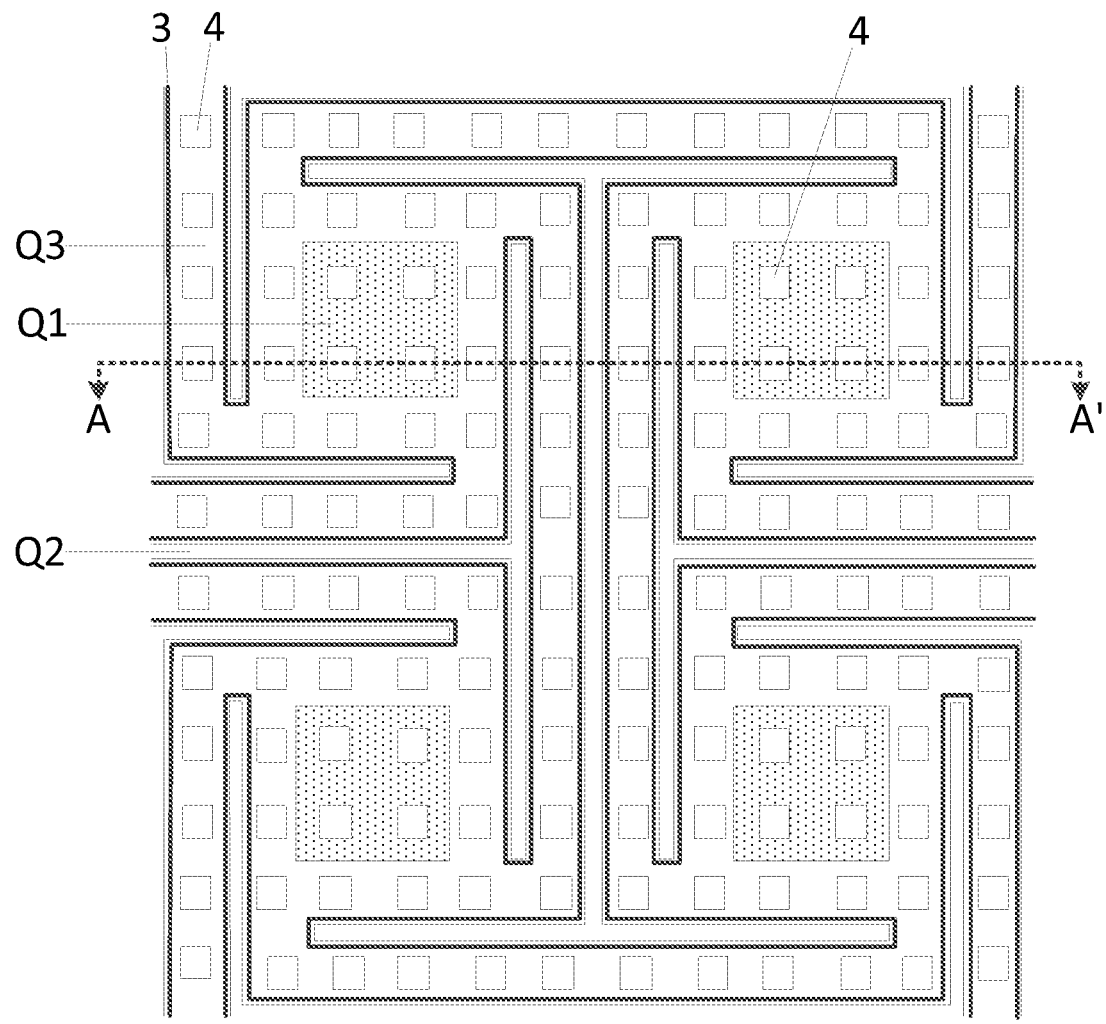
FIG. 1 is a schematic top view of a stretchable display substrate according to an embodiment of the present disclosure.
Figure 2:
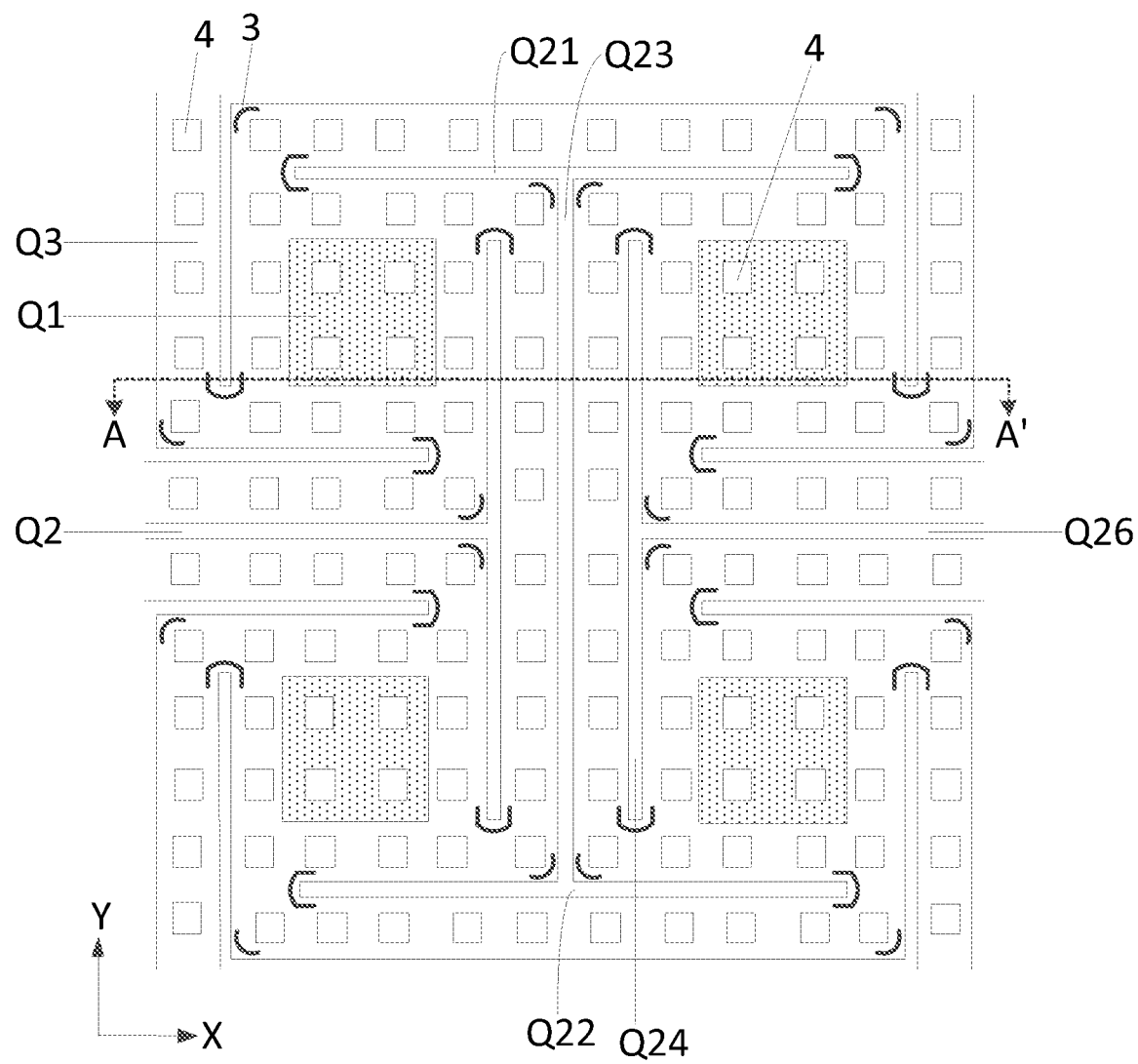
FIG. 2 is a schematic top view of another stretchable display substrate according to an embodiment of the present disclosure.

An embodiment of the present disclosure provides a stretchable display substrate, as shown in FIG. 1 and FIG. 2, including a plurality of hole regions Q2. The hole regions Q2 are configured to provide a deformation space for the display substrate during stretching.

Figure 3:
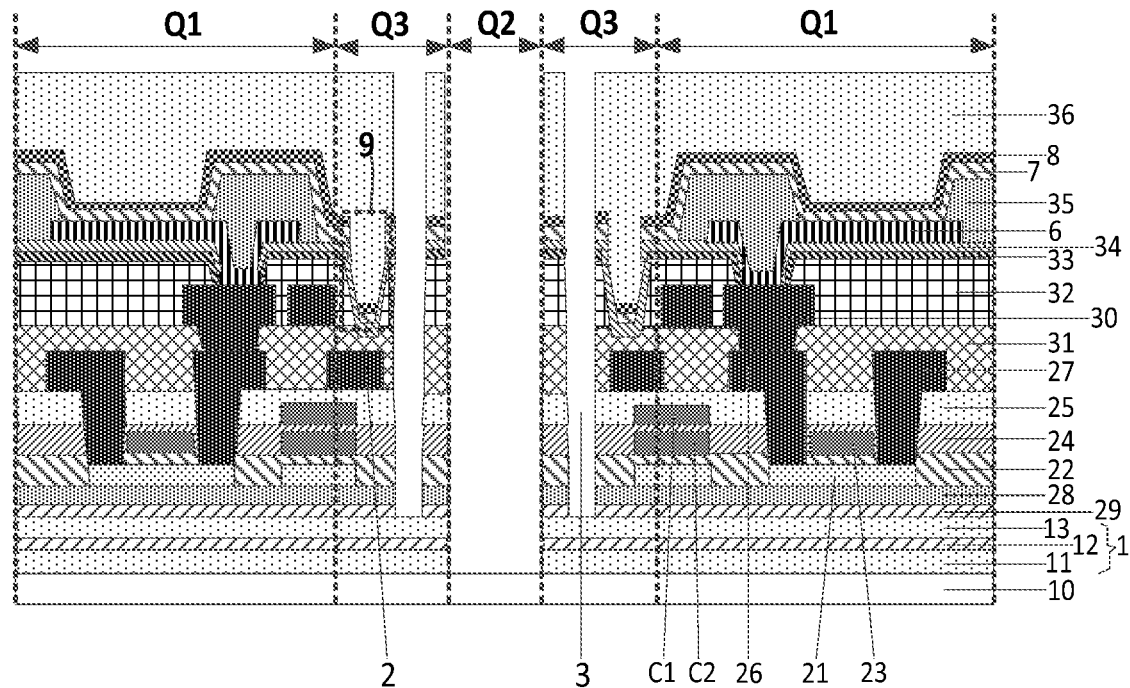
FIG. 3 is a schematic cross-sectional view in a direction AA' in FIG. 1.
Figure 4:
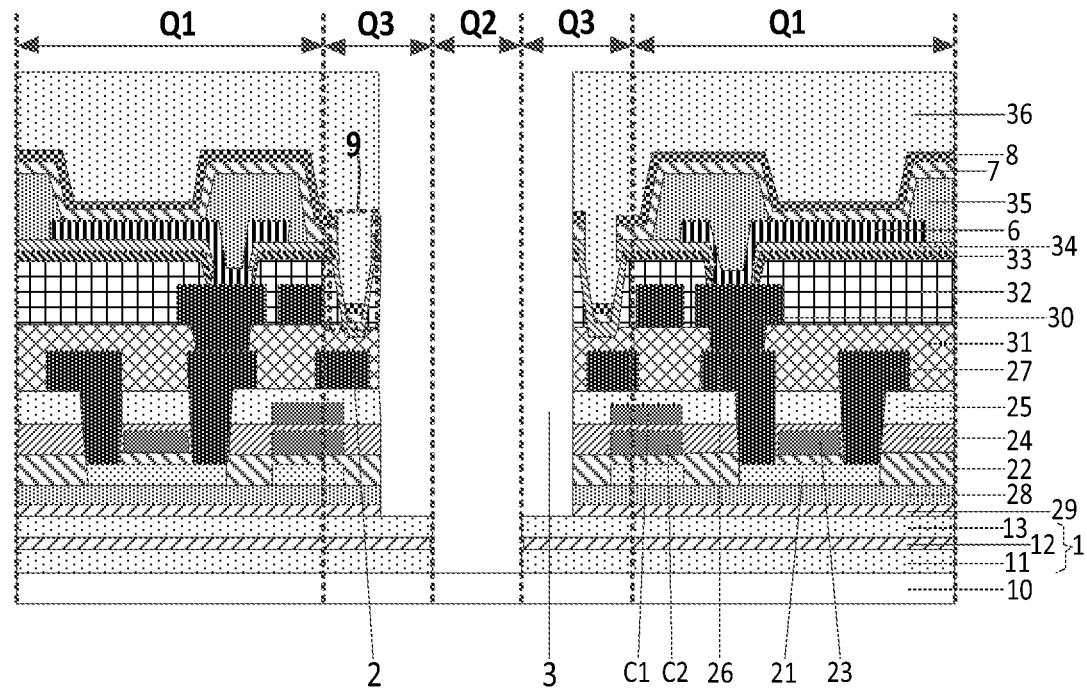
FIG. 4 is a schematic cross-sectional view in a direction AA' in FIG. 2.

As shown in FIG. 3 and FIG. 4, FIG. 3 is a schematic cross-sectional view of a partial structure in a direction AA' in FIG. 1, and FIG. 4 is a schematic cross-sectional view of a partial structure in the direction AA' in FIG. 2. The stretchable display substrate includes:

a base 1, wherein the base 1 may be a flexible base, such that a stretchable region of the stretchable display substrate may be stretched;

pixel units 4, disposed on the base 1;

signal lines 2, disposed on the base 1, and electrically connected with the pixel units 4, wherein the signal lines 2 may include a gate line, a data line, etc.; and a plurality of inorganic insulating layers, stacked on the base 1, wherein at least one layer of the plurality of inorganic insulating layers has first hollowed-out portions 3 close to the hole regions Q2, and orthographic projections of the first hollowed-out portions 3 on the base 1 do not overlap orthographic projections of the signal lines 2 and the pixel units 4 on the base 1.

When the above stretchable display substrate provided by the embodiment of the present disclosure is stretched, positions close to the hole regions Q2 are subjected to tensile force and deformed. Since at least one layer of the plurality of inorganic insulating layers has the first hollowed-out portions 3 close to the hole regions Q2, that is, at least one layer of the plurality of inorganic insulating layers is removed from the positions close to the hole regions Q2, the buckling deformation behavior of the positions close to the hole regions Q2 when stretched may be improved, the positions close to the hole regions Q2 are less likely to be broken, and the pixel units 4 are less likely to be damaged, thereby improving tensile properties of the stretchable display substrate.

It should be noted that, as shown in FIG. 1 and FIG. 2, the hole regions Q2 in the embodiment of the present disclosure may completely penetrate through the stretchable display substrate. Of course, the hole regions Q2 may also penetrate through all film layers on the base of the stretchable display substrate as well as part of the base.

It should be noted that, as shown in FIG. 3 and FIG. 4, the embodiment of the present disclosure is schematically illustrated with all the inorganic insulating layers on the base 1 being removed to form the first hollowed-out portions 3 as an example. Of course, any one of the inorganic insulating layers or multiple inorganic insulating layers may also be removed to form the first hollowed-out portions 3.

During specific implementation, a stretchable panel with structural design of island bridges in the related art faces problems such as a low display resolution (PPI) and uneven display, and in order to improve the display resolution and solve the problem of uneven display, as shown in FIG. 1 to FIG. 4, the stretchable display substrate provided by the embodiment of the present disclosure further includes: a plurality of pixel island regions Q1 located at intervals among the hole regions Q2, and connecting bridge regions Q3 located between the pixel island regions Q1 and the hole regions Q2. The pixel island regions Q1 are configured to display images, and the connecting bridge regions Q3 are configured for wiring (for signal communication between adjacent pixel island regions Q1) and transferring tensile force.

Each connecting bridge region Q3 includes at least one pixel unit 4. The first hollowed-out portions 3 are located in the connecting bridge regions Q3, and the first hollowed-out portions 3 are located between the pixel units 4 of the connecting bridge regions Q3 and the hole regions Q2. That is, the present disclosure extends from originally only disposing pixel units in the pixel island regions Q1 to further disposing pixel units in the connecting bridge regions Q3, such that the display resolution may be improved and the problem of uneven display may be solved.

As shown in FIG. 1 to FIG. 4, the connecting bridge regions Q3 include a plurality of pixel units 4, and the orthographic projections of the signal lines 2 on the base 1 are located at least in orthographic projections of the pixel units 4 of the connecting bridge regions Q3 and regions between the pixel units 4 of the connecting bridge regions Q3 on the base 1. That is, the signal lines 2 are routed under the pixel units 4 in the connecting bridge regions Q3 and the regions between the pixel units 4 to realize electrical connection between the pixel units 4.

During specific implementation, in the stretchable display substrate provided by embodiments of the present disclosure, as shown in FIG. 1, an extending direction of the first hollowed-out portions 3 is substantially the same as edges of the hole regions Q2. In this way, the first hollowed-out portions 3 surrounding the hole regions Q2 are disposed around the hole regions Q2, so as to further improve the tensile properties of the stretchable display substrate.

During specific implementation, in the stretchable display substrate provided by embodiments of the present disclosure, as shown in FIG. 3, the first hollowed-out portions 3 do not communicate with the hole regions Q2. Since the first hollowed-out portions 3 are formed in at least one layer of the plurality of inorganic insulating layers, that is, a plurality of inorganic insulating layers are retained between the first hollowed-out portions 3 and the hole regions Q2, the buckling deformation behavior of the connecting bridge regions Q3 when stretched is improved by removing at least one inorganic insulating layer in the connecting bridge regions Q3 to form the first hollowed-out portions 3, such that the connecting bridge regions Q3 are less likely to be broken, and the pixel island regions Q1 adjacent to the connecting bridge regions Q3 are less likely to be damaged, thereby improving the tensile properties of the stretchable display substrate.

During specific implementation, in the stretchable display substrate provided by embodiments of the present disclosure, as shown in FIG. 3, a distance between a side wall, close to the corresponding hole region Q2, of each first hollowed-out portion 3 and a side wall, close to the corresponding first hollowed-out portion 3, of each hole region Q2 (the distance is a width of the inorganic insulating layers between the hole regions Q2 and the first hollowed-out portions 3) is greater than or equal to 2 μm.

During specific implementation, in order to reduce the difficulty of a preparation process, in the stretchable display substrate provided by embodiments of the present disclosure, as shown in FIG. 3, in a direction from the pixel island regions Q1 to the hole regions Q2, a width of the first hollowed-out portions 3 is greater than or equal to 5 μm. Thus, when each inorganic insulating layer is removed by exposure, development and etching process, the difficulty of the exposure, development and etching process may be reduced.

During specific implementation, in the stretchable display substrate provided by embodiments of the present disclosure, as shown in FIG. 4, the first hollowed-out portions 3 and the hole regions Q2 communicate with each other. That is, when the inorganic insulating layers are etched in the connecting bridge regions Q3, the inorganic insulating layers of the connecting bridge regions Q3 are directly etched to communicate with the hole regions Q2 to further reduce the inorganic insulating layers of the connecting the bridge regions Q3, thereby further improving the tensile properties of the connecting bridge regions Q3.

During specific implementation, in the stretchable display substrate provided by embodiments of the present disclosure, as shown in FIG. 4, an edge, close to the corresponding hole region Q2, of each first hollowed-out portion 3 overlaps an edge, close to the corresponding first hollowed-out portion 3, of each hole region Q2, that is, no inorganic insulating layer is retained between the first hollowed-out portions 3 and the hole regions Q2. That is, when the inorganic insulating layers are etched in the connecting bridge regions Q3, regions, corresponding to the first hollowed-out portions 3, of the inorganic insulating layers are directly etched to the edges of the hole regions Q2 to further reduce the inorganic insulating layers in the connecting the bridge regions Q3, thereby further improving the tensile properties of the connecting bridge regions Q3.

During specific implementation, in the stretchable display substrate provided by embodiments of the present disclosure, as shown in FIG. 3 and FIG. 4, each pixel unit 4 includes at least one sub-pixel, the sub-pixel includes a pixel circuit and a light-emitting device, the pixel circuit is located between the light-emitting device and the base 1, and the light-emitting device includes an anode 6, an organic light-emitting layer 7 and a cathode 8 which are stacked. A partition structure 9 is disposed at a position, close to the corresponding pixel unit 4, in each connecting bridge region Q3. The partition structures 9 are disposed around the first hollowed-out portions 3 in FIG. 1 and FIG. 2, that is, the partition structures 9 are located between the pixel units 4 and the first hollowed-out portions 3. The organic light-emitting layers 7 are disconnected at the partition structures 9, and the cathodes 8 are disconnected at the partition structures 9. Since the partition structures 9 are located in the connecting bridge regions Q3, and the connecting bridge regions Q3 are located between the hole regions Q2 and the pixel island regions Q1, the organic light-emitting layers 7 and the cathodes 8 disconnected by the partition structures 9 are partially located in the pixel island regions Q1, and partially close to the hole regions Q2. The organic light-emitting layers 7 and the cathodes 8 close to the hole regions Q2 are likely to be invaded by water and oxygen. By dividing the organic light-emitting layers 7 and the cathodes 8 into two parts disconnected from each other, a separation path distance for the water and oxygen in the organic light-emitting layers 7 and the cathodes 8 close to the hole regions Q2 to invade the organic light-emitting layers 7 and the cathodes 8 in the sub-pixels is effectively shortened, that is, it is ensured that water and oxygen cannot invade the organic light-emitting layers 7 and the cathodes 8 in the sub-pixels, thereby ensuring normal display of a display product.

The light-emitting devices may have red (R) light-emitting devices emitting red light, green (G) light-emitting devices emitting green light, and blue (B) light-emitting devices emitting blue light. The light-emitting devices may be inorganic light-emitting diodes, or organic light-emitting diodes (OLEDs) made of organic materials, or micro light-emitting diodes (Micro LEDs), or mini light-emitting diodes (mini LEDs). The micro light-emitting diodes refer to ultra-small inorganic light-emitting elements with a size of 100 microns or below that emit light without backlight and filters.

The pixel circuits may adopt various structures, for example, the pixel circuits may include a structure of 2 transistors and 1 capacitor (2T1C), or a structure of 7 transistors and 1 capacitor (7T1C), or a structure of 12 transistors and 1 capacitor (12T1C), etc. Each pixel circuit generally includes a driving transistor and other switching transistors, as shown in FIG. 3 and FIG. 4 which are schematic diagrams of the driving transistor, the light-emitting device and a storage capacitor in the pixel circuit. The driving transistor may be a top-gate type, and includes an active layer 21, a first gate insulating layer 22, a gate 23, a second gate insulating layer 24, an interlayer dielectric layer 25, a source 26, and a drain 27 which are stacked on the base 1. Optionally, the active layer 21 may be formed on a buffer layer 28, the buffer layer 28 is disposed on a first barrier layer 29, the first gate insulating layer 22 covers the buffer layer 28 and the active layer 21, the gate 23 is formed on a side, facing away from the active layer 21, of the first gate insulating layer 22, the second gate insulating layer 24 covers the gate 23 and the first gate insulating layer 22, the interlayer dielectric layer 25 covers the second gate insulating layer 24, the source 26 and the drain 27 are formed on a side, facing away from the base 1, of the interlayer dielectric layer 25, and are located on two opposite sides of the gate 23, respectively, and the source 26 and the drain 27 may respectively make contact with two opposite sides of the active layer 21 through via holes. As shown in FIG. 3 and FIG. 4, a capacitor structure (for example, the storage capacitor Cst in the pixel circuit) may include a first electrode plate C1 and a second electrode plate C2. The second electrode plate C2 and the gate 23 are arranged in the same layer. The first electrode plate C1 is located between the second gate insulating layer 24 and the interlayer dielectric layer 25, and the first electrode plate C1 is opposite to the second electrode plate C2.

As shown in FIG. 3 and FIG. 4, signal lines 2 located in the connecting bridge regions Q3 are disposed in a film layer where the sources 26 and the drains 27 are located. The anodes 6 and the drains 27 of the light-emitting devices may be electrically connected directly (i.e., a single-layer SD structure), or through overlap electrodes 30 located between the anodes 6 and the drains 27 (i.e., a double-layer SD structure). A first planar layer 31 is disposed between the overlap electrodes 30 and the drains 27. A second planar layer 32, a first passivation layer 33 and a second passivation layer 34 are disposed between the overlap electrodes 30 and the anodes 6. Each light-emitting device in the stretchable display substrate is generally defined by a pixel-defining layer 35. The pixel-defining layer 35 has aperture regions exposing the light-emitting devices.

In the stretchable display substrate provided by embodiments of the present disclosure, the base may include a flexible layer, or as shown in FIG. 3 and FIG. 4, the base 1 includes a first flexible layer 11, a second barrier layer 12, and a second flexible layer 13 stacked on a side, facing away from the buffer layer 28, of the first barrier layer 29.

Optionally, a material of the flexible layer may be polyimide (PI), polyester, polyamide, etc.

Optionally, as shown in FIG. 3 and FIG. 4, the base 1 may be disposed on a glass substrate 10 to facilitate subsequent peeling.

Optionally, as shown in FIG. 3 and FIG. 4, a distance between side walls, close to the pixel units 4, of the first hollowed-out portions 3 and the partition structures 9 (that is, a width of inorganic insulating layers between the first hollowed-out portions 3 and the partition structures 9) may be greater than or equal to 2 µm. The organic light-emitting layers 7 are disconnected at the partition structures 9, and the cathodes 8 are disconnected at the partition structures 9.

During specific implementation, in the stretchable display substrate provided by embodiments of the present disclosure, as shown in FIG. 1, the first hollowed-out portions 3 are closed structures disposed around the hole regions Q2, such that the inorganic insulating layers of the connecting bridge regions Q3 may be removed as much as possible, thereby improving the tensile properties of the connecting bridge regions to the greatest extent.

During specific implementation, since water and oxygen likely to invade the pixel units from the hole regions, in order to block water and oxygen invasion paths at various positions in the hole regions, in the stretchable display substrate provided in the embodiment of the present disclosure, as shown in FIG. 3, the partition structures 9 are closed structures disposed around the first hollowed-out portions 3. That is, diagrams of orthographic projections of the partition structures 9 on the base 1 are the same as boundary diagrams of the hole regions Q2, that is, the partition structures 9 are disposed around the hole regions Q2, such that it may be ensured that the partition structures 9 prevent water and oxygen from invading the pixel island regions Q1 from the hole regions Q2 at various positions.

During specific implementation, in the stretchable display substrate provided by embodiments of the present disclosure, as shown in FIG. 2, a part of the hole regions Q2 include: a first sub-hole region Q21 and a second sub-hole region Q22 extending in a first direction X and arranged in a second direction Y, and a third sub-hole region Q23 extending in the second direction Y; and another part of the hole regions Q2 include: a fourth sub-hole region Q24 and a fifth sub-hole region (not shown) extending in the second direction Y and arranged in the first direction X, and a sixth sub-hole region Q26 extending in the first direction X. The first direction X and the second direction Y are substantially perpendicular. The sixth sub-hole region Q26 is substantially connected to center regions of the fourth sub-hole region Q24 and the fifth sub-hole region.

When the stretchable display substrate is stretched, as shown in FIG. 2, one side (corner) of a connecting position of the first sub-hole region Q21 and the third sub-hole region Q23, one side of a connecting position of the second sub-hole region Q22 and the third sub-hole region Q23 (corner), one side of an end of the first sub-hole region Q21 and one side of an end of the second sub-hole region Q22, one side (corner) of a connecting position of the fourth sub-hole region Q24 and the sixth sub-hole region Q26, one side of a connecting position of the fifth sub-hole region and the sixth sub-hole region Q26, and one side of an end of the fourth sub-hole region Q24 and one side of an end of the fifth sub-hole region are all stress concentrations generated during stretching, and inorganic insulating layers at these positions are the first to break. In order to avoid the breakage of the inorganic insulating layers at these positions, the first hollowed-out portions 3 are disposed at at least one of the following positions: one side of the connecting position of the first sub-hole region Q21 and the third sub-hole region Q23, one side of the connecting position of the second sub-hole region Q22 and the third sub-hole region Q23, one side of the end of the first sub-hole region Q21 and one side of the end of the second sub-hole region Q22, one side of the connecting position of the fourth sub-hole region Q24 and the sixth sub-hole region Q26, one side of the connecting position of the fifth sub-hole region and the sixth sub-hole region Q26, and one side of the end of the fourth sub-hole region Q24 and one side of the end of the fifth sub-hole region. In this way, in a first aspect, the difficulty of preparing large-area first hollowed-out portions 3 can be reduced, and in addition, the problem of breakage of the inorganic insulating layers at the positions where the inorganic insulating layers corresponding to the hole regions Q2 are likely to break can be solved.

It should be noted that, as shown in FIG. 1 and FIG. 2, the embodiment of the present disclosure is schematically illustrated with the hole regions Q2 being approximately in a shape of character "‡" as an example. Of course, the shape of the hole regions Q2 is not limited to this, for example, it may also be "T" or a line.

Optionally, in the stretchable display substrate provided by embodiments of the present disclosure, as shown in FIG. 2, one side of the connecting position of the first sub-hole region Q21 and the third sub-hole region Q23, one side of the connecting position of the second sub-hole region Q22 and the third sub-hole region Q23, one side of the end of the first sub-hole region Q21 and one side of the end of the second sub-hole region Q22, one side of the connecting position of the fourth sub-hole region Q24 and the sixth sub-hole region Q26, one side of the connecting position of the fifth sub-hole region and the sixth sub-hole region Q26, and one side of the end of the fourth sub-hole region Q24 and one side of the end of the fifth sub-hole region are all provided with the first hollowed-out portions 3.

In the stretchable display substrate provided by embodiments of the present disclosure, as shown in FIG. 1 and FIG. 2, each pixel island region Q1 includes at least one pixel unit 4, and a pixel resolution of the pixel island regions Q1 is substantially the same as a pixel resolution of the connecting bridge regions Q3. In this way, the display resolution may be improved, and the problem of uneven display may be solved.

In the stretchable display substrate provided by embodiments of the present disclosure, as shown in FIG. 3 and FIG. 4, the plurality of inorganic insulating layers include the first barrier layer 29, the buffer layer 28, the first gate insulating layer 22, the second gate insulating layer 24, the interlayer dielectric layer 25, the first passivation layer 33, the second passivation layer 34 and the inorganic encapsulation layer 36 which are stacked on the base 1. At least one of the first barrier layer 29, the buffer layer 28, the first gate insulating layer 22, the second gate insulating layer 24, the interlayer dielectric layer 25, the first passivation layer 33, the second passivation layer 34 and the inorganic encapsulation layer 36 is provided with the first hollowed-out portions 3.

During specific implementation, in the stretchable display substrate provided by embodiments of the present disclosure, as shown in FIG. 3 and FIG. 4, the interlayer dielectric layer 25, the first passivation layer 33, the second passivation layer 34, and the inorganic encapsulation layer 36 are all provided with the first hollowed-out portions 3, and the first hollowed-out portions 3 substantially overlap. Of course, during specific implementation, the first barrier layer 29, the buffer layer 28, the first gate insulating layer 22, and the second gate insulating layer 24 may also be all provided with the first hollowed-out portions 3.

It should be noted that, as shown in FIG. 3 and FIG. 4, the embodiments of the present disclosure are schematically illustrated with the first barrier layer 29, the buffer layer 28, the first gate insulating layer 22, the second gate insulating layer 24, the interlayer dielectric layer 25, the first passivation layer 33, the second passivation layer 34, and the inorganic encapsulation layer 36 being all provided with the first hollowed-out portions 3 as an example. Of course, when the plurality of inorganic insulating layers are provided with the first hollowed-out portions 3 (that is, each inorganic insulating layer is etched to hollow out the inorganic insulating layers at corresponding regions), the hollow-out treatment of the plurality of inorganic insulating layers may be hollowing out from the inorganic encapsulation layer 36 on a topmost side to any inorganic insulating layer above the second flexible layer 13, for example, directly hollowing out to be above the second flexible layer 13, or directly hollowing out to any one of the first barrier layer 29, the buffer layer 28, the first gate insulating layer 22, the second gate insulating layer 24, the interlayer dielectric layer 25, the first passivation layer 33, the second passivation layer 34, and the inorganic encapsulation layer 36. The first barrier layer 29, the buffer layer 28, the first gate insulating layer 22, the second gate insulating layer 24, and the interlayer dielectric layer 25 may be hollowed out by using the etching process once or twice in a preparation process of the stretchable display substrate. The inorganic encapsulation layer 36 is hollowed out by etching thinning through a single exposure and etching process after being fabricated. Of course, all the inorganic insulating layers may also be hollowed out by a single exposure and deep-hole etching process after being fabricated. The specific etching process may be selected according to actual needs.

During specific implementation, in the stretchable display substrate provided by embodiments of the present disclosure, as shown in FIG. 3 and FIG. 4, the inorganic encapsulation layer 36 includes a first inorganic layer and a second inorganic layer stacked on the second passivation layer 34.

The stretchable display substrate further includes: the first planar layer 31 and the second planar layer 32 located between the interlayer dielectric layer 25 and the first passivation layer 33, the pixel defining layer 35 located between the second passivation layer 34 and the inorganic encapsulation layer 36, and an organic layer located between the first inorganic layer and the second inorganic layer.

At least one of the first planar layer 31, the second planar layer 32, the pixel defining layer 35 and the organic layer has second hollowed-out portions close to the hole regions Q2. The first hollowed-out portions 3 and the second hollowed-out portions substantially overlap.

It should be understood that the first barrier layer 29, the buffer layer 28, the first gate insulating layer 22, the second gate insulating layer 24, the interlayer dielectric layer 25, the first passivation layer 33, the second passivation layer 34, and the inorganic encapsulation layer 36 mentioned in embodiments of the present disclosure may be made of inorganic insulating materials such as silicon oxide and silicon nitride. The first planar layer 31, the second planar layer 32, the pixel defining layer 35, and the organic layer may be organic film layers, that is, they may be made of organic insulating materials such as photoresist and PI.

It should be noted that when all the inorganic insulating layers on the base 1 are etched away in the connecting bridge regions Q3, the first planar layer 31, the second planar layer 32, the pixel defining layer 35, and the organic layer may also etched away, that is, via holes penetrating through all the inorganic insulating layers and the organic insulating layers are formed in the connecting bridge regions Q3, which may be represented by the first hollowed-out portions 3.

The inventors of this case have tested the tensile properties of the stretchable display substrate provided by the embodiment of the present disclosure as shown in FIG. 3 and a stretchable display substrate without first hollowed-out portions in connecting bridge regions in the related art. The test found that the stretching amount of the present disclosure is approximately 2%, and the stretching amount in the related art is less than 1%, such that the stretchable display substrate provided by the embodiment of the present disclosure obviously improves the tensile properties.

Figure 5:
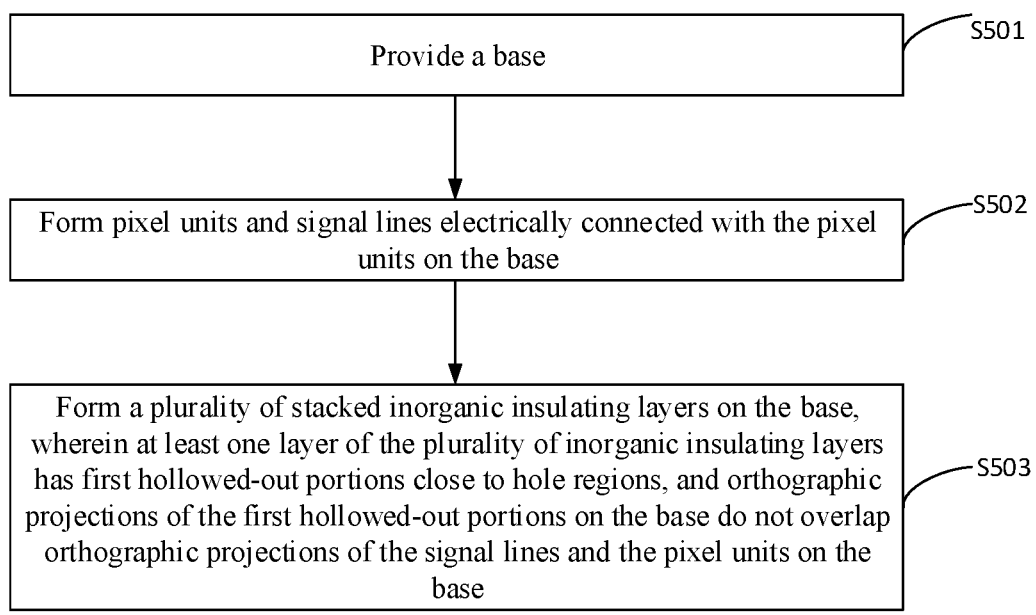
FIG. 5 is a flow diagram of a preparation method of a stretchable display substrate according to an embodiment of the present disclosure.

Based on the same inventive concept, an embodiment of the present disclosure further provides a preparation method of the above stretchable display substrate, as shown in FIG. 5, including:

S501, a base is provided;

S502, pixel units and signal lines electrically connected to the pixel units are formed on the base; and S503, a plurality of stacked inorganic insulating layers are formed on the base. At least one layer of the plurality of inorganic insulating layers has first hollowed-out portions close to hole regions, and orthographic projections of the first hollowed-out portions on the base do not overlap orthographic projections of the signal lines and the pixel units on the base.

Figure 6:
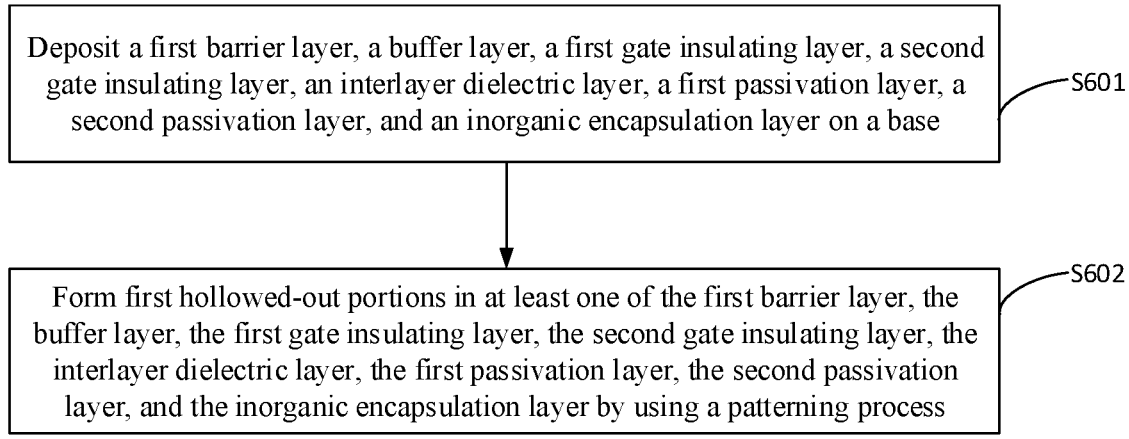
FIG. 6 is a flow diagram of a preparation method of another stretchable display substrate according to an embodiment of the present disclosure.

During specific implementation, in the above preparation method provided by the embodiment of the present disclosure, at least one layer of the plurality of inorganic insulating layers having the first hollowed-out portions close to the hole regions, as shown in FIG. 6, specifically includes:

S601, a first barrier layer, a buffer layer, a first gate insulating layer, a second gate insulating layer, an interlayer dielectric layer, a first passivation layer, a second passivation layer, and an inorganic encapsulation layer are deposited on the base; and S602, the first hollowed-out portions are formed in at least one of the first barrier layer, the buffer layer, the first gate insulating layer, the second gate insulating layer, the interlayer dielectric layer, the first passivation layer, the second passivation layer, and the inorganic encapsulation layer by using a patterning process.

A process for forming each layer structure in the embodiment of the present disclosure may include a patterning process, a photolithography process, etc. The patterning process may include film deposition, photoresist coating, mask exposure, development, etching, photoresist stripping, and other treatments, and the photolithography process may include film coating, mask exposure, development, etc. Evaporation, deposition, coating, spreading, etc. used are all mature preparation processes in the related art.

The preparation process of the stretchable display substrate shown in FIG. 3 is described in detail below, and may include the following steps.

Figure 7A:
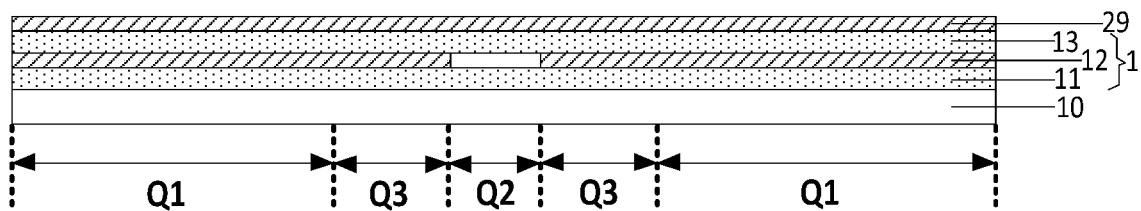
FIG. 7A is a schematic structural diagram of step 1 performed in a preparation method of a stretchable display substrate according to an embodiment of the present disclosure.

(1) Taking the base 1 including two flexible layer structures as an example, the base 1 is divided into pixel island regions Q1, a hole region Q2 and connecting bridge regions Q3, and a first flexible layer 11, a second barrier layer 12 and a second flexible layer 13 which are stacked in sequence are formed on a glass substrate 10. When the second barrier layer 12 is formed, a position, corresponding to the hole region Q2, of the second barrier layer 12 is etched away. Then, the first barrier layer 29 is formed on the second flexible layer 13, as shown in FIG. 7A. A material of the flexible layers may be polyimide (PI), polyester, polyamide, etc. A material of the barrier layers may be silicon nitride (SiNx) or silicon oxide (SiOx), etc., so as to improve the water and oxygen resistance of the base.

Figure 7B:
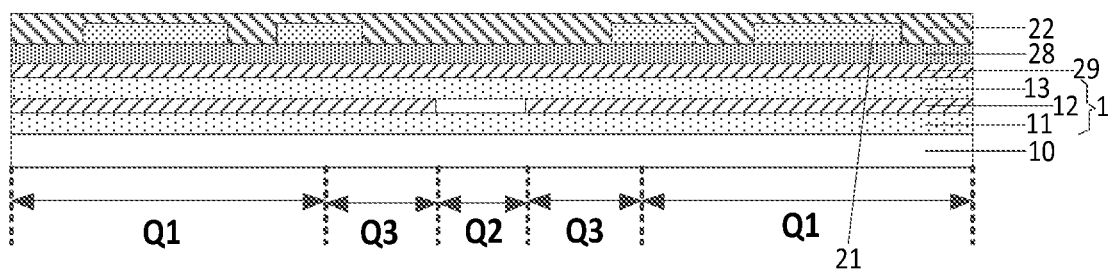
FIG. 7B is a schematic structural diagram of step 2 performed in a preparation method of a stretchable display substrate according to an embodiment of the present disclosure.

(2) The buffer layer 28 is formed on the first barrier layer 29, an active layer film is deposited on the buffer layer 28, an active layer 21 is formed on the buffer layer 28 by patterning the active layer film through a patterning process, and the first gate insulating layer 22 is formed on the active layer 21, as shown in FIG. 7B.

Figure 7C:
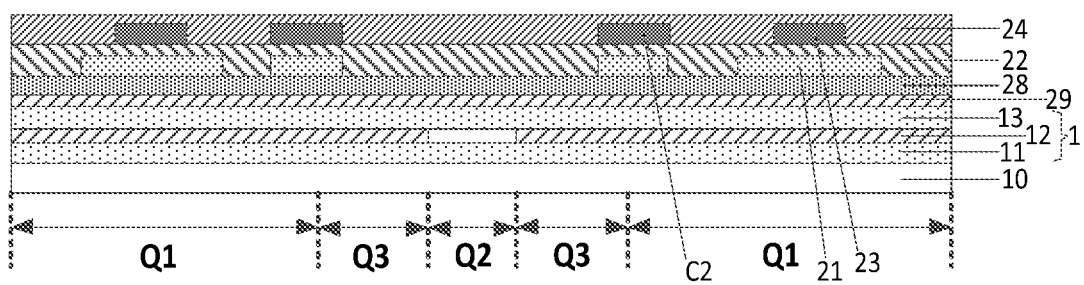
FIG. 7C is a schematic structural diagram of step 3 performed in a preparation method of a stretchable display substrate according to an embodiment of the present disclosure.

(3) A layer of metal film is deposited on the first gate insulating layer 22, gates 23, second electrode plates C2, grid lines (not shown) and gate connecting lines (not shown) formed in the connecting bridge regions Q3 are formed on the first gate insulating layer 22 by patterning the metal film through a patterning process, and then, the second gate insulating layer 24 is formed on the gates 23, as shown in FIG. 7C.

Figure 7D:
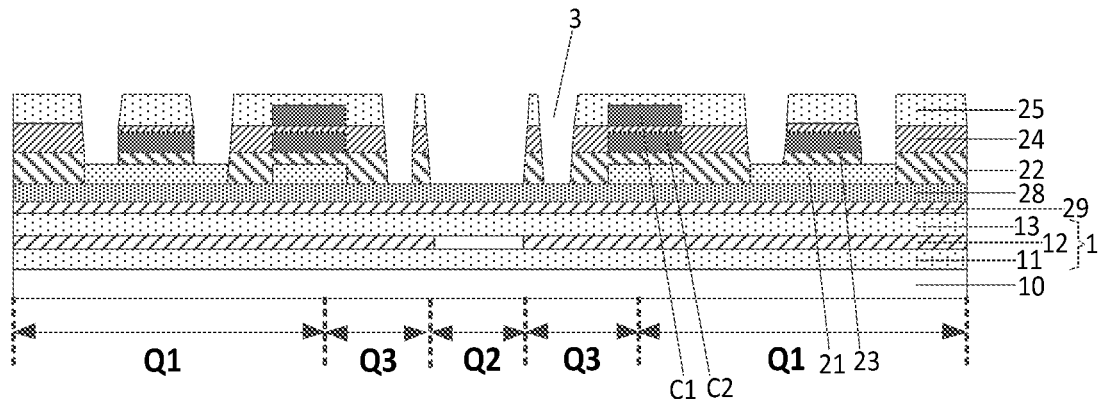
FIG. 7D is a schematic structural diagram of step 4 performed in a preparation method of a stretchable display substrate according to an embodiment of the present disclosure.

(4) A layer of metal film is deposited on the second gate insulating layer 24, and first electrode plates C1 are formed on the second insulating layer 24 by patterning the metal film through a patterning process, wherein the first electrode plates C1 correspond to the second electrode plates C2 in position. Then, the interlayer dielectric layer 25 is formed on the film layer where the first electrode plates C1 are located, and via holes located above both ends of the active layer 21, via holes corresponding to the hole regions Q2 and first hollowed-out portions 3 corresponding to the connecting bridge regions Q3 are formed by patterning the first gate insulating layer 22, the second gate insulating layer 24 and the interlayer dielectric layer 25, as shown in FIG. 7D.

Figure 7E:
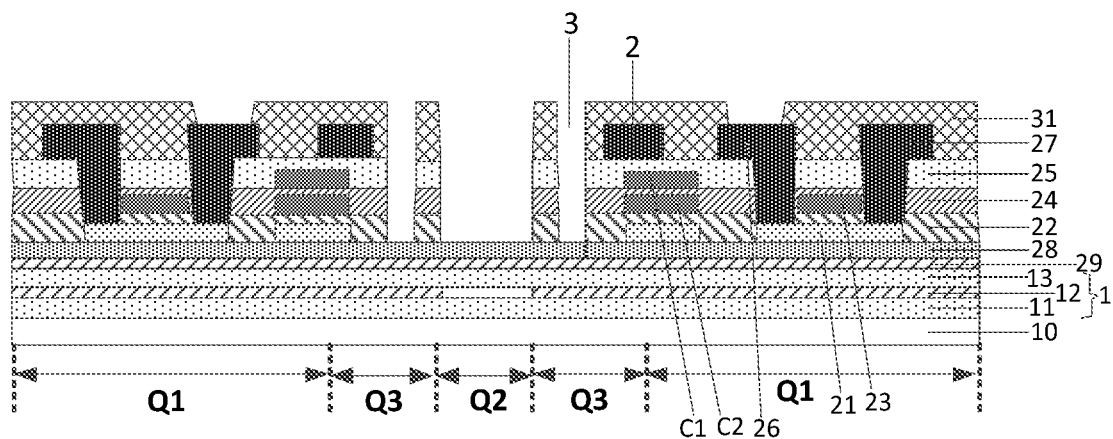
FIG. 7E is a schematic structural diagram of step 5 performed in a preparation method of a stretchable display substrate according to an embodiment of the present disclosure.

(5) A layer of metal film (a layer SD1) is deposited on the interlayer dielectric layer 25, and sources 26, drains 27 and the signal lines 2 (data lines) are formed on the interlayer dielectric layer 25 by patterning the metal film through a patterning process, wherein the sources 26 and the drains 27 are respectively connected with the active layer 21 through via holes penetrating through the first gate insulating layer 22, the second gate insulating layer 24 and the interlayer dielectric layer 25. Then, a planar film coated with an organic material is formed on the base 1 with the sources 26 and the drains 27, a first planar layer 31 is formed by masking, exposure and developing processes, and positions, corresponding to the sources 26, the hole region Q2 and the first hollowed-out portions 3 in the connecting bridge regions Q3, of the first planar layer 31 are all developed away, as shown in FIG. 7E.

Figure 7F:
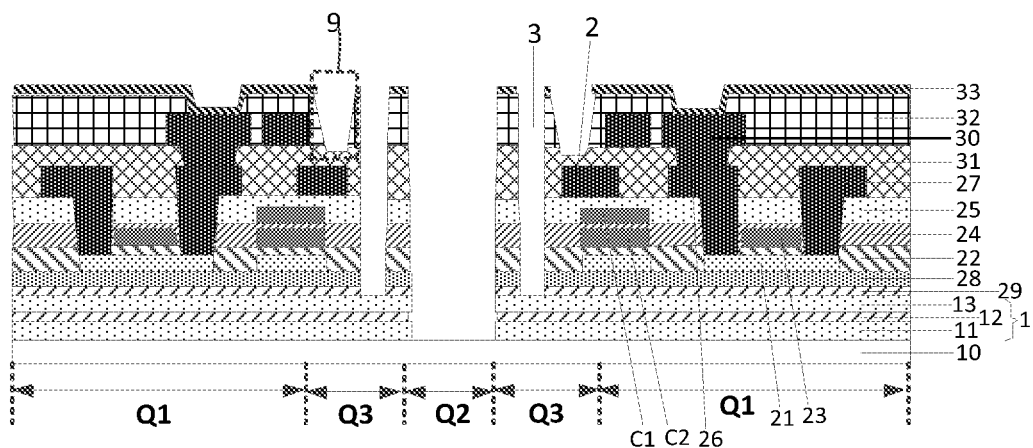
FIG. 7F is a schematic structural diagram of step 6 performed in a preparation method of a stretchable display substrate according to an embodiment of the present disclosure.

(6) A layer of metal film (a layer SD2, also there may be no layer SD2) is deposited on the first planar layer 31, and lap electrodes 30 are formed on the first planar layer 31 by patterning the metal film through a patterning process. A planar film coated with an organic material is formed on the film layer where the lap electrodes 30 are located, a second planar layer 32 is formed by masking, exposure and developing processes, and positions, corresponding to the lap electrodes 30, the hole region Q2 and the first hollowed-out portions 3, of the second planar layer 32 are all developed away. Then, an inorganic insulating material is deposited on the second planar layer 32. Then, the buffer layer 28 and the first barrier layer 29 in the hole region Q2 as well as the first flexible layer 11 and the second flexible layer 13 in the hole region Q2 are first etched away. Positions, corresponding to the first hollowed-out portions 3, of the inorganic insulating material, the buffer layer 28 and the first barrier layer 29 are etched away. Positions, corresponding to positions where partition structures 9 are correspondingly formed of the connecting bridge regions Q3, of the inorganic insulating material, the second planar layer 32 and part of the first planar layer 31 are etched away. The first passivation layer 33 is formed on the etched inorganic insulating material, as shown in FIG. 7F.

Figure 7G:
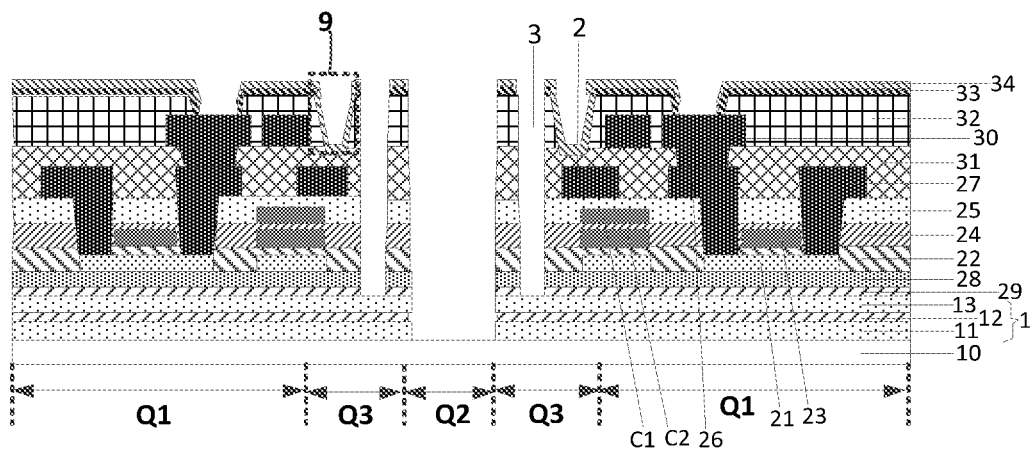
FIG. 7G is a schematic structural diagram of step 7 performed in a preparation method of a stretchable display substrate according to an embodiment of the present disclosure.

(7) An inorganic insulating material is deposited on the first passivation layer 33, positions, corresponding to the hole region Q2 and the first hollowed-out portions 3, of the inorganic insulating material are etched away, and positions, corresponding to the lap electrodes 30, of the inorganic insulating material and the first passivation layer 33 are etched away to form the second passivation layer 34, as shown in FIG. 7G.

Figure 7H:
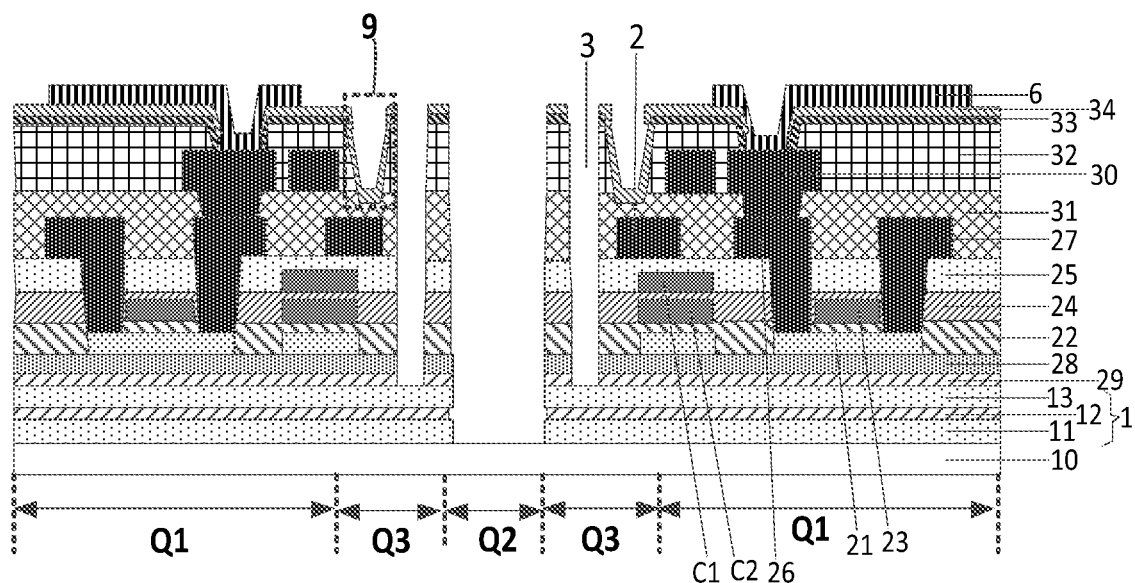
FIG. 7H is a schematic structural diagram of step 8 performed in a preparation method of a stretchable display substrate according to an embodiment of the present disclosure.

(8) A conductive film is deposited on the second passivation layer 34, an anode 6 is formed by patterning the conductive film through a patterning process, and the anode 6 penetrates through via holes of the first passivation layer 33 and the second passivation layer 34 to be electrically connected with the lap electrodes 30, as shown in FIG. 7H.

In an exemplary implementation, the conductive film may be of a three-layer stacked structure of a transparent conductive film/a metal film/a transparent conductive film. A material of the transparent conductive film may be indium tin oxide ITO or indium zinc oxide IZO, and the metal film may be a metal film of Al, Ag, Cu, etc.

Figure 7I:
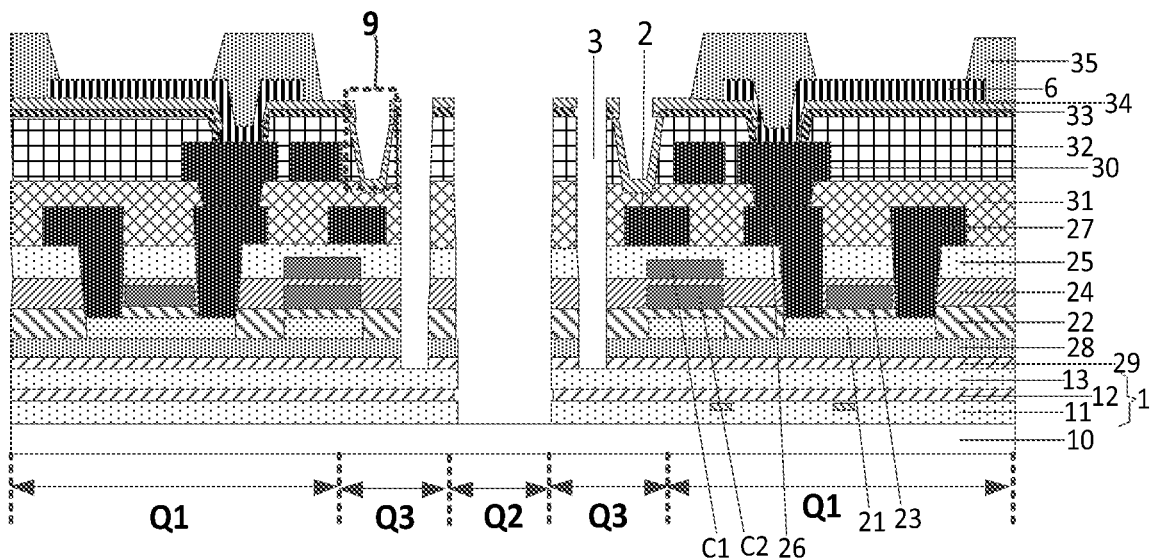
FIG. 7I is a schematic structural diagram of step 9 performed in a preparation method of a stretchable display substrate according to an embodiment of the present disclosure.

(9) The anode 6 is coated with a pixel defining film, and a pixel defining layer 35 is formed by masking, exposing, and developing processes. Pixel apertures are disposed in the pixel defining layer 35 in the pixel island regions Q1, and the pixel defining layer 35 in the pixel apertures is developed away to expose a surface of the anode 6. In addition, positions, corresponding to the hole regions Q2 and the connecting bridge regions Q3, of the pixel defining layer 35 are all developed away, as shown in FIG. 7I.

Figure 7J:
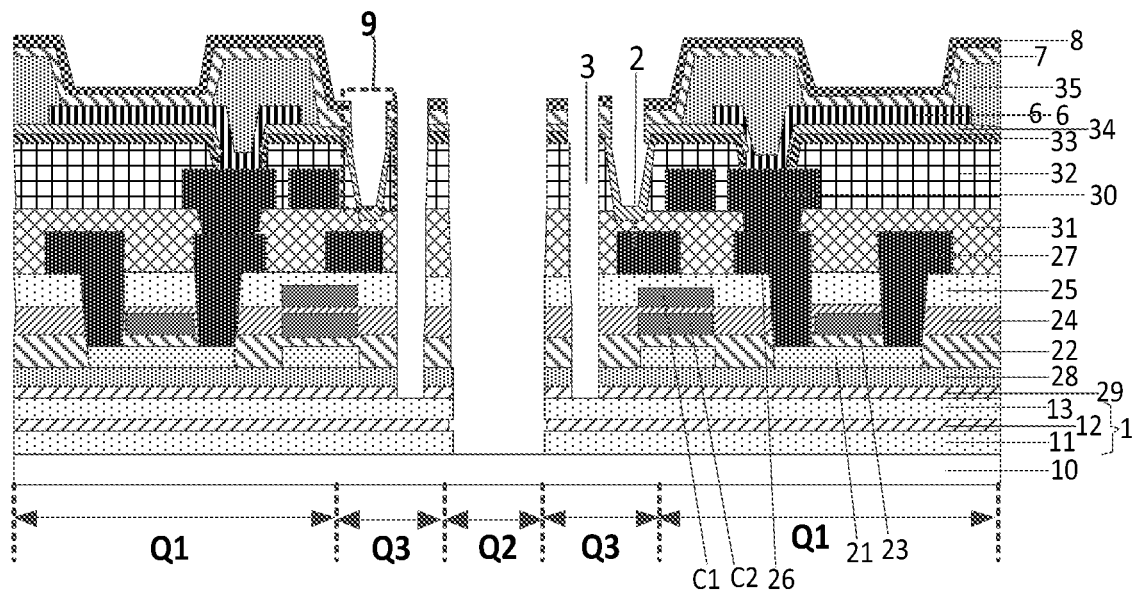
FIG. 7J is a schematic structural diagram of step 10 performed in a preparation method of a stretchable display substrate according to an embodiment of the present disclosure.

(10) An organic light-emitting layer 7 and a cathode 8 are formed in the pixel defining layer 35 in sequence, the organic light-emitting layer 7 is formed in the pixel apertures of the pixel defining layer 35 and is connected with the anode 6, and the organic light-emitting layer 7 and the cathode 8 are respectively disconnected at the positions of the partition structures 9, as shown in FIG. 7J. Optionally, the organic light-emitting layer 7 and the cathode 8 may both be prepared and formed through an evaporation process. A material of the cathode 8 may be any one or more of magnesium (Mg), silver (Ag), aluminum (Al), copper (Cu) and lithium (Li), or an alloy prepared from any one or more of the above metals.

Figure 7K:
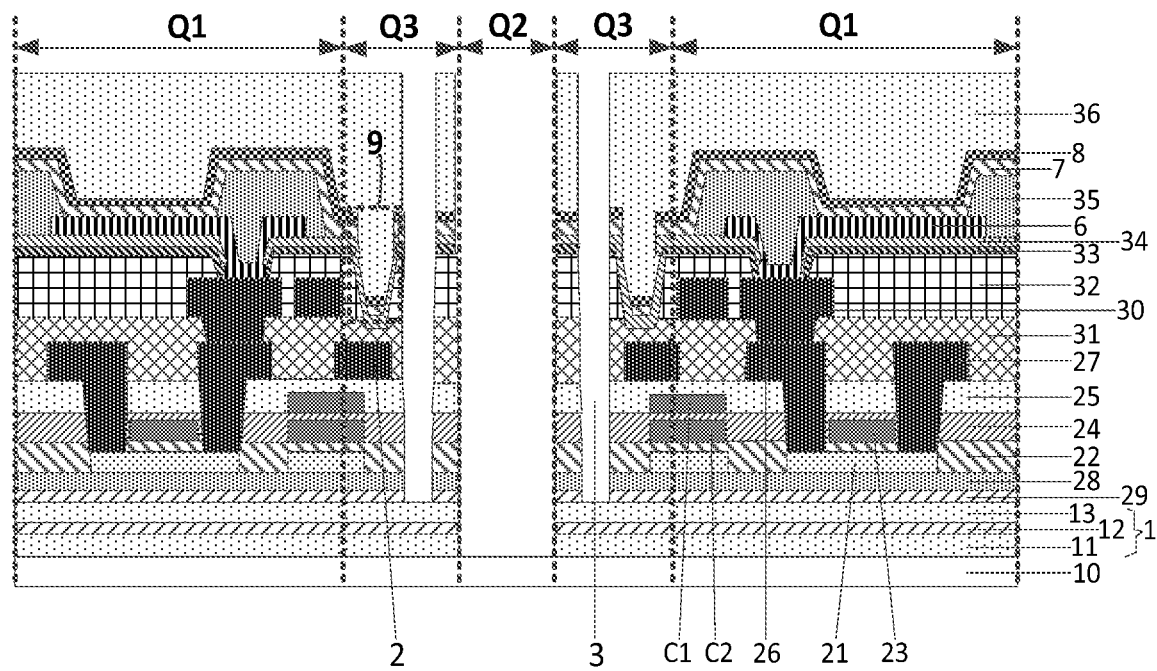
FIG. 7K is a schematic structural diagram of step 11 performed in a preparation method of a stretchable display substrate according to an embodiment of the present disclosure.

(11) The inorganic encapsulation layer 36 is formed on the cathode 8, wherein the inorganic encapsulation layer 36 may include a first inorganic layer, an organic layer and a second inorganic layer which are stacked; and positions, corresponding to the hole regions 2 and the first hollowed-out portions 3, of the inorganic encapsulation layer 36, the cathode 8 and the organic light-emitting layer 7 are etched away, as shown in FIG. 7K. That is, the stretchable display substrate provided by embodiments of the present disclosure as shown in FIG. 3 is formed.

It should be noted that embodiments of the present disclosure is described by taking the preparation method of the stretchable display substrate shown in FIG. 3 as an example, and a preparation method of the stretchable display substrate shown in FIG. 4 is the same as that shown in FIG. 3. The difference is that all the inorganic insulating layers and organic insulating layers between the first hollowed-out portions 3 and the hole region Q2 in FIG. 3 are etched away to form a structure in which the first hollowed-out portions 3 communicates with the hole regions Q2. The preparation method shown in FIG. 4 will not be described in detail. The etching of the inorganic insulating layers and the organic insulating layers between the first hollowed-out portions 3 and the hole regions Q2 may be etched together with the same film layer in other regions during etching.

Finally, the stretchable display substrate may be obtained by peeling off the glass substrate 10 below the stretchable display substrate shown in FIG. 3 and FIG. 4 from the stretchable display substrate.

Based on the same inventive concept, an embodiment of the present disclosure further provides a display apparatus, including any of the above stretchable display substrates provided by the embodiment of the present disclosure. The display apparatus may be any product or component with a display function, such as a mobile phone, a tablet computer, a TV, a monitor, a notebook computer, a digital photo frame and a navigator. For the implementation of the display apparatus, reference may be made to the above embodiment of the stretchable display substrate, which will not be repeated here.

The above display apparatus may be an organic light-emitting diode display panel, a quantum dot light-emitting diode display panel, a display module, a curved screen mobile phone, a smart watch, or any other product or component with a display function.

According to the stretchable display substrate, the preparation method of the stretchable display substrate, and the display apparatus provided by the embodiments of the present disclosure, when the stretchable display substrate is stretched, the adjacent connecting bridge regions close to the hole regions are subjected to tensile force and deformed. Since at least one layer of the plurality of inorganic insulating layers has the first hollowed-out portions close to the hole regions in the connecting bridge regions, that is, at least one layer of the plurality of inorganic insulating layers is removed from the positions, close to the hole regions, in the connecting bridge regions, the buckling deformation behavior of the connecting bridge regions when stretched may be improved, such that the connecting bridge regions are less likely to break, and the pixel island regions adjacent to the connecting bridge regions are less likely to be damaged, thereby improving the tensile properties of the stretchable display substrate.

It will be apparent to those skilled in the art that various modifications and variations can be made in the present disclosure without departing from the spirit or scope of the present disclosure. Thus, it is intended that the present disclosure cover the modifications and variations of the present disclosure provided they come within the scope of the appended claims and their equivalents of the present disclosure.

What is claimed is:

1. A stretchable display substrate, comprising a plurality of hole regions;
   a base;
   pixel units disposed on the base;
   signal lines disposed on the base, and electrically connected with the pixel units; and
   a plurality of inorganic insulating layers stacked on the base, wherein at least one of the plurality of inorganic insulating layers comprises a first hollowed-out portion close to the hole regions, and an orthographic projection of the first hollowed-out portion on the base does not overlap orthographic projections of the signal lines and the pixel units on the base;
   wherein the stretchable display substrate further comprises:
   a plurality of pixel island regions being at intervals among the hole regions, and a connecting bridge region between the pixel island regions and the hole regions, wherein
      the connecting bridge region comprises at least one of the pixel units, the first hollowed-out portion is in the connecting bridge region, and the first hollowed-out portion is between the at least one of the pixel units of the connecting bridge region and the hole regions;
      wherein the connecting bridge region comprises a plurality of pixel units, and the orthographic projections of the signal lines on the base are at least in orthographic projections of the pixel units of the connecting bridge region and regions between the pixel units of the connecting bridge region on the base.

2. The stretchable display substrate according to claim 1, wherein an extending direction of the first hollowed-out portion is substantially identical to an extending direction of edges of the hole regions.

3. The stretchable display substrate according to claim 1, wherein the first hollowed-out portion does not communicate with the hole regions;
wherein a distance between a side wall, close to a corresponding hole region, of the first hollowed-out portion and a side wall, close to a corresponding first hollowed-out portion, of each of the hole regions is greater than or equal to 2 μm.

4. The stretchable display substrate according to claim 3, wherein a width in a direction from the pixel island regions to the hole regions, of the first hollowed-out portion is greater than or equal to 5 μm.

5. The stretchable display substrate according to claim 3, wherein each of the pixel units comprises at least one sub-pixel, the sub-pixel comprises a pixel circuit and a light-emitting device, and the light-emitting device comprises an anode, an organic light-emitting layer and a cathode which are stacked; a partition structure is disposed at a position, close to a corresponding pixel unit, in the connecting bridge region, the organic light-emitting layer is disconnected at the partition structure, and the cathode is disconnected at the partition structure; and
a distance between side walls, close to the pixel units, of the first hollowed-out portions and the partition structures is greater than or equal to 2 μm.

6. The stretchable display substrate according to claim 3, wherein the first hollowed-out portion is a closed structure disposed around the hole regions;
wherein the partition structure is a closed structure disposed around the first hollowed-out portion.

7. The stretchable display substrate according to claim 1, wherein the first hollowed-out portion and the hole regions communicate with each other.

8. The stretchable display substrate according to claim 7, wherein an edge, close to a corresponding hole region, of the first hollowed-out portion overlaps an edge, close to a corresponding first hollowed-out portion, of each of the hole regions.

9. The stretchable display substrate according to claim 1, wherein a part of the hole regions comprise: a first sub-hole region and a second sub-hole region extending in a first direction and arranged in a second direction, and a third sub-hole region extending in the second direction; another part of the hole regions comprise: a fourth sub-hole region and a fifth sub-hole region extending in the second direction and arranged in the first direction, and a sixth sub-hole region extending in the first direction; the first direction and the second direction are substantially perpendicular, the third sub-hole region is substantially connected to center regions of the first sub-hole region and the second sub-hole region, and the sixth sub-hole region is substantially connected to center regions of the fourth sub-hole region and the fifth sub-hole region; and
the first hollowed-out portion is disposed on at least one of following positions: one side of a connecting position of the first sub-hole region and the third sub-hole region, one side of a connecting position of the second sub-hole region and the third sub-hole region, one side of an end of the first sub-hole region and one side of an end of the second sub-hole region, one side of a connecting position of the fourth sub-hole region and the sixth sub-hole region, one side of a connecting position of the fifth sub-hole region and the sixth sub-hole region, and one side of an end of the fourth sub-hole region and one side of an end of the fifth sub-hole region.

10. The stretchable display substrate according to claim 9, wherein one side of the connecting position of the first sub-hole region and the third sub-hole region, one side of the connecting position of the second sub-hole region and the third sub-hole region, one side of the end of the first sub-hole region and one side of the end of the second sub-hole region, one side of the connecting position of the fourth sub-hole region and the sixth sub-hole region, one side of the connecting position of the fifth sub-hole region and the sixth sub-hole region, and one side of the end of the fourth sub-hole region and one side of the end of the fifth sub-hole region are all provided with the first hollowed-out portion.

11. The stretchable display substrate according to claim 1, wherein each of the pixel island regions comprises at least one of the pixel units, and a pixel resolution of the pixel island regions is substantially identical to a pixel resolution of the connecting bridge region.

12. The stretchable display substrate according to claim 1, wherein the plurality of inorganic insulating layers comprise a first barrier layer, a buffer layer, a first gate insulating layer, a second gate insulating layer, an interlayer dielectric layer, a first passivation layer, a second passivation layer and an inorganic encapsulation layer which are stacked on the base, and at least one of the first barrier layer, the buffer layer, the first gate insulating layer, the second gate insulating layer, the interlayer dielectric layer, the first passivation layer, the second passivation layer and the inorganic encapsulation layer is provided with the first hollowed-out portion.

13. The stretchable display substrate according to claim 12, wherein the interlayer dielectric layer, the first passivation layer, the second passivation layer and the inorganic encapsulation layer are all provided with the first hollowed-out portion, and first hollowed-out portions substantially overlap.

14. The stretchable display substrate according to claim 12, wherein the inorganic encapsulation layer comprises a first inorganic layer and a second inorganic layer stacked on the second passivation layer;
the stretchable display substrate further comprises: a first planar layer and a second planar layer between the interlayer dielectric layer and the first passivation layer, a pixel defining layer between the second passivation layer and the inorganic encapsulation layer, and an organic layer between the first inorganic layer and the second inorganic layer; and
at least one of the first planar layer, the second planar layer, the pixel defining layer and the organic layer comprises a second hollowed-out portion close to the hole regions, and the first hollowed-out portion and the second hollowed-out portion substantially overlap.

15. The stretchable display substrate according to claim 12, wherein the base comprises a flexible layer, or the base comprises a first flexible layer, a second barrier layer, and a second flexible layer stacked on a side, facing away from the buffer layer, of the first barrier layer.

16. A display apparatus, comprising the stretchable display substrate according to claim 1.

17. A preparation method of the stretchable display substrate according to claim 1, comprising:
providing the base;
forming the pixel units and the signal lines electrically connected with the pixel units on the base; and
forming the plurality of inorganic insulating layers stacked on the base.

18. The preparation method according to claim 17, wherein the forming the plurality of inorganic insulating layers stacked on the base, comprises:

depositing a first barrier layer, a buffer layer, a first gate insulating layer, a second gate insulating layer, an interlayer dielectric layer, a first passivation layer, a second passivation layer, and an inorganic encapsulation layer on the base; and forming the first hollowed-out portion in at least one of the first barrier layer, the buffer layer, the first gate insulating layer, the second gate insulating layer, the interlayer dielectric layer, the first passivation layer, the second passivation layer, and the inorganic encapsulation layer by using a patterning process.

\* \* \* \* \*